United States Patent [19]
Lee et al.

[11] Patent Number: 5,447,880
[45] Date of Patent: Sep. 5, 1995

[54] METHOD FOR FORMING AN AMORPHOUS SILICON PROGRAMMABLE ELEMENT

[75] Inventors: Steven S. Lee; Kenneth P. Fuchs; Gayle W. Miller, all of Colorado Springs, Colo.

[73] Assignees: AT&T Global Information Solutions Company, Dayton, Ohio; Hyundai Electronics America, Milpitas, Calif.

[21] Appl. No.: 224,609

[22] Filed: Apr. 5, 1994

Related U.S. Application Data

[62] Division of Ser. No. 994,835, Dec. 22, 1992, abandoned.

[51] Int. Cl.⁶ .................... H01L 21/70; H01L 27/00
[52] U.S. Cl. ........................... 437/60; 437/922; 437/228; 437/101; 257/530; 257/50
[58] Field of Search ............... 437/922, 60, 228, 101; 257/530, 50

[56] References Cited

U.S. PATENT DOCUMENTS

| | | | |
|---|---|---|---|
| 3,717,852 | 2/1973 | Abbas et al. | 340/173 SP |
| 4,499,557 | 2/1985 | Holmberg et al. | 365/163 |
| 4,823,181 | 4/1989 | Mohsen et al. | 357/51 |
| 4,862,243 | 8/1989 | Welch et al. | 357/51 |
| 4,906,593 | 3/1990 | Shioya et al. | 437/192 |
| 4,914,055 | 4/1990 | Gordon et al. | 437/192 |
| 5,166,556 | 11/1992 | Hsu et al. | 257/530 |
| 5,196,724 | 3/1993 | Gordon et al. | 257/530 |
| 5,233,217 | 8/1993 | Dixit et al. | 257/530 |

*Primary Examiner*—Olik Chaudhuri
*Assistant Examiner*—H. Jey Tsai
*Attorney, Agent, or Firm*—Wayne P. Bailey; Paul W. Martin

[57] ABSTRACT

A method for forming an amorphous silicon programmable element which requires less than about one square micron of area. The method includes the steps of forming a bottom conductor, depositing an interlayer dielectric above the bottom conductor, forming a via in the interlayer dielectric, depositing an anti-fuse layer above the bottom conductor within the via, and chemical vapor depositing a conductive plug above the anti-fuse layer and within the via. The method may additionally include the step of chemical vapor depositing a top conductor above the conductive plug.

14 Claims, 1 Drawing Sheet

METHOD FOR FORMING AN AMORPHOUS SILICON PROGRAMMABLE ELEMENT

This is a division of application Ser. No. 07/994,834, filed Dec. 22, 1992 now abandoned.

BACKGROUND OF THE INVENTION

The present invention relates to programmable elements within integrated circuits, and more specifically to an amorphous silicon programmable element.

Anti-fuse devices are commonly used in one-time programmable elements within integrated circuit chips. The anti-fuse material forms a high resistance barrier until programmed. Programming is typically performed by applying a voltage across the element.

Known programmable elements typically employ aluminum as the primary conducting material. Thus, the degree of miniaturization that can be achieved with such elements is limited. Such designs cannot be reliably fabricated using less than one square micron of area. Also, such elements are necessarily complex in design. See, for example, U.S. Pat. No. 4,914,055 to Gordon et al., and U.S. Pat. No. 4,823,181 to Mohsen et al.

Therefore, it would be desirable to provide a programmable element which requires significantly less area to manufacture and which can be easily manufactured at the same time that other devices on the chip are being fabricated.

SUMMARY OF THE INVENTION

In accordance with the teachings of the present invention, an amorphous silicon programmable element is provided. The element includes a bottom conductor, which is preferably made of aluminum or an aluminum alloy. An anti-fuse layer, preferably amorphous silicon, lies above the bottom conductor. A conductive plug, preferably made of tungsten, lies above the anti-fuse layer. The element additionally includes an interlayer dielectric above the bottom conductor having an anti-fuse via lined by the anti-fuse layer and containing the conductive plug, and a top conductor, which may be part of the conductive plug or part of a separately deposited layer.

Schottky barriers exist between the bottom conductor and the anti-fuse layer, between the anti-fuse layer and the conductive plug, and between the conductive plug and the top conductor, if the top conductor is a metal different than the metal employed to form the conductive plug. The largest barrier to be overcome by programming is the barrier between the conductive plug and the anti-fuse layer.

Provision is also made for logical vias connecting the conductive plug directly to the bottom conductor. Such vias do not have a layer of anti-fuse material between the conductive plug and the bottom conductor.

The element of the present invention is preferably fabricated by depositing the interlayer dielectric on the bottom conductor. The anti-fuse via is etched through the interlayer dielectric. A logical via may also be etched at this time. The anti-fuse layer is deposited over the interlayer dielectric and the exposed bottom conductor. If a logical via is also desired, a mask and etch operation is performed to remove the anti-fuse layer from the bottom of the metal-connecting via. Plug material is deposited as a layer using a chemical vapor deposition (CVD) process so as to fill the anti-fuse and logical vias. Top conductors may then be formed by etching away unwanted plug material, leaving one top conductor for each via. Alternatively, the plug material may be etched back to the interlayer dielectric to planarize the element for deposition of a top conductive layer made of a metal different than the metal forming the plug material. Finally, portions of the top conductive layer are etched away, leaving one top conductor for each via.

It is a feature of the present invention that the use of a CVD process to fill the vias allows the element of the present invention to be manufactured using significantly less area than previous designs. The element of the present invention may require no more than one square micron of area, due to the excellent step coverage which can be achieved by the CVD process (and which cannot be achieved by sputtering methods). The CVD method of the present invention can fill any via having a size about two tenths of a square angstrom, which is impossible under conventional sputtering methods.

It is also a feature of the present invention that the element may be fabricated during fabrication of other devices on the chip.

It is accordingly an object of the present invention to provide an amorphous silicon programmable element.

It is another object of the present invention to provide an amorphous silicon programmable element which employs a CVD process to significantly reduce the area required for fabrication.

It is another object of the present invention to provide an amorphous silicon programmable element which is easily fabricated at the same time that other devices on the chip are fabricated.

BRIEF DESCRIPTION OF THE DRAWINGS

Additional benefits and advantages of the present invention will become apparent to those skilled in the art to which this invention relates from the subsequent description of the preferred embodiments and the appended claims, taken in conjunction with the accompanying drawings, in which:

DETAILED DESCRIPTION OF THE PREFERRED EMBODIMENT

Figure 1:
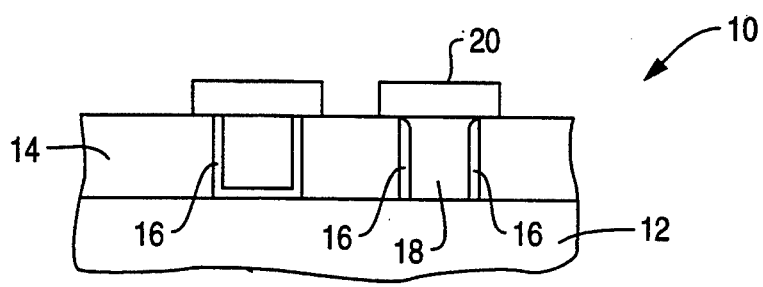
FIG. 1 is a cross-sectional view of the programmable element of the present invention.

Referring now to FIG. 1, programmable element 10 includes bottom conductor 12, interlayer dielectric 14, anti-fuse layer 16, conductive plug 18, and top conductor 20. Schottky barriers exist between bottom conductor 12 and anti-fuse layer 16, between anti-fuse layer 16 and conductive plug 18, and between conductive plug 18 and top conductor 20, if top conductor 20 is a metal different than the metal employed to form conductive plug 18. The largest barrier to be overcome by programming is the barrier between conductive plug 18 and anti-fuse layer 16.

Bottom conductor 12 may be made of aluminum, titanium, tungsten, or aluminum alloys combining aluminum with titanium nitride, titanium, titanium silicide, or tungsten silicide.

Interlayer dielectric 14 is preferably silicon dioxide.

Anti-fuse layer 16 is preferably an amorphous silicon layer.

Conductive plug 18 is preferably tungsten, although other CVD materials such as platinum, palladium, and cobalt may be used.

Finally, top conductor 20 may be the same material as conductive plug 18, or it may be a lower resistance material such as aluminum or aluminum alloys.

Figure 2:
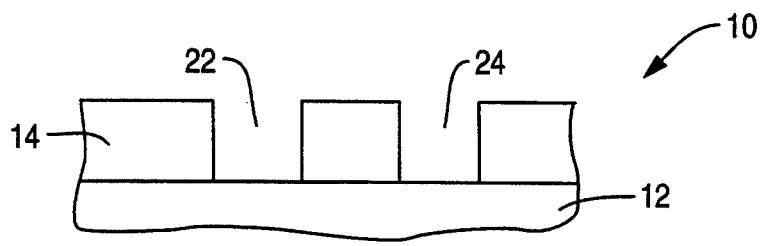
FIG. 2 is a cross-sectional view of the programmable element of FIG. 1 at a first stage of fabrication.

Referring now to FIGS. 2–6, the method of fabricating element 10 is shown in more detail. With reference to FIG. 2, bottom conductor 12 is formed using known methods. Interlayer dielectric 14 is deposited using known methods. Via 22 is an anti-fuse via, while via 24 is a logical via. Advantageously, vias 22 and 24 are formed at the same time using a single mask and etch operation.

Figure 3:
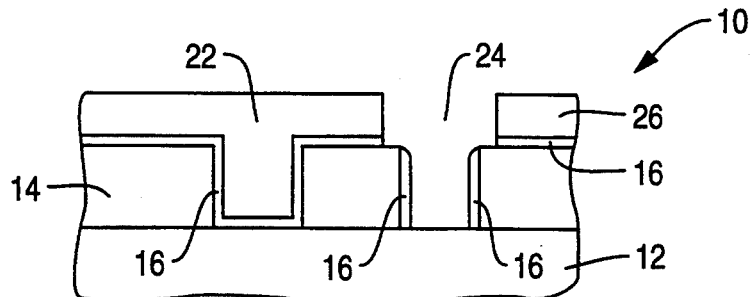
FIG. 3 is a cross-sectional view of the programmable element of FIG. 1 at a second stage of fabrication.

With reference to FIG. 3, anti-fuse layer 16 is deposited onto bottom conductor 12, and the top and sides of interlayer dielectric 14. Preferably, a sputtering process is employed to deposit amorphous silicon to a thickness of about 50–500 angstroms.

After deposition of anti-fuse layer 16, portions of anti-fuse layer 16 are removed around via 24. Specifically, photoresist layer 26 is deposited over anti-fuse layer 16, except over via 24. Anti-fuse layer 16 is etched away from the unprotected area, mainly from the top surface of interlayer dielectric 14 around via 24 and from the bottom of via 24.

Figure 4:
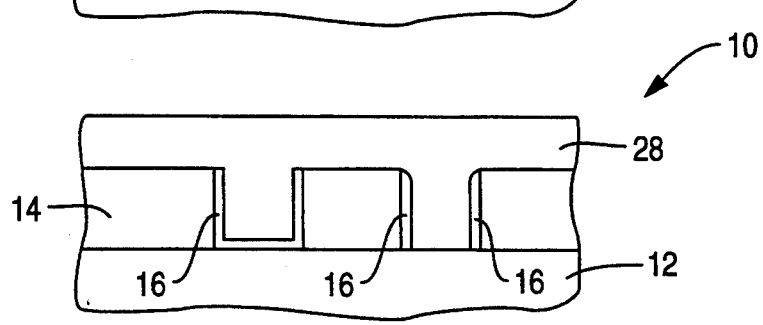
FIG. 4 is a cross-sectional view of the programmable element of FIG. 1 at a third stage of fabrication.

With reference to FIG. 4, layer 28 of plug material is deposited by a CVD process so as to fill vias 22 and 24. Use of the CVD process allows element 10 to require no more than about one square micron of area, which is a significant reduction over prior art designs. Preferably, tungsten is deposited. Advantageously, amorphous silicon acts like a glue layer for tungsten.

Figure 5:
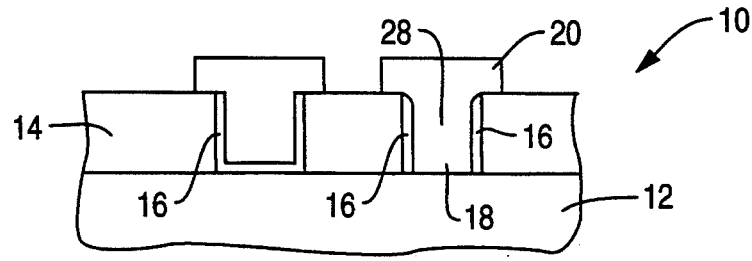
FIG. 5 is a cross-sectional view of the programmable element at a fourth stage of fabrication.

With reference to FIG. 5, element 10 may include top conductor 20 of the same material as conductive plug 18. In such a case, a mask and etch operation is performed to remove portions of layer 28, leaving behind top conductor 20.

Figure 6:
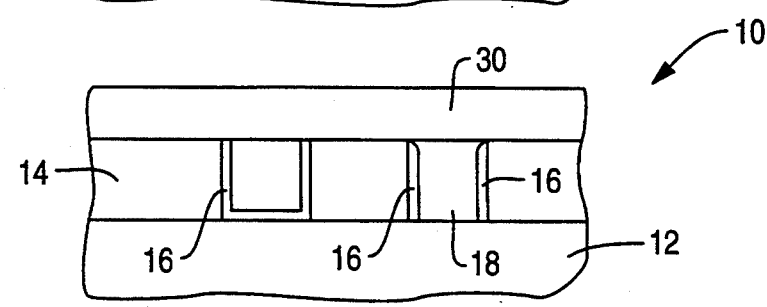
FIG. 6 is a cross-sectional view of the programmable element of FIG. 1 at an alternative fourth stage of fabrication.

Alternatively, with reference to FIG. 6, element 10 may be optionally processed to include a different material for top conductor 20 than the material used for conductive plug 18. This may be necessary if the resistance of conductive plug is too high. Layer 28 is etched back to interlayer dielectric layer 14 to planarize element 10. Preferably, a plasma etch process is employed using sulfur fluoride, dioxide, or dichloride plasmas.

Finally, a top conductive layer 30 is deposited using known methods. Portions of top conductive layer 30 are removed, except over vias 22 and 24, by known methods, to form top conductors 20 as depicted in FIG. 1. Preferably, a mask and etch process is employed.

An array of elements 10 may be formed by connecting top conductors 20 to each other and bottom conductors 12 to each other. Permanent electrical connections may be formed by supplying a voltage of about 10–30 volts across the bottom and top conductors 12 and 20. Application of the programming voltage causes the amorphous silicon of anti-fuse layer 16 to react with the tungsten of conductive plug 18 to form a low resistance compound tungsten silicide, which facilitates conduction through element 10. The direction of the supplied voltage is chosen to minimize damage to other devices on the chip during programming.

Finally, if anti-fuse layer 16 is boron-doped amorphous silicon, the boron concentration can be adjusted to modify the Schottky characteristics, and thereby adjust the programming threshold. Thus, if 10–30 volts is too high, a higher concentration of boron in the amorphous silicon will reduce the required programming voltage.

Although the present invention has been described with particular reference to certain preferred embodiments thereof, variations and modifications of the present invention can be effected within the spirit and scope of the following claims.

What is claimed is:

1. A method for forming a programmable element comprising the steps of:
    providing a bottom conductive layer;
    depositing an interlayer dielectric on top of the bottom conductive layer;
    forming a via having sidewalls in the interlayer dielectric;
    forming an other via having sidewalls in the interlayer dielectric coincident with the step of forming the via;
    depositing an amorphous silicon anti-fuse layer on top of the interlayer dielectric and on the sidewalls and the bottom conductive layers within the via and other via;
    etching away the anti-fuse layer from the bottom of the other via, and leaving the amorphous silicon anti-fuse layer on the sidewalls of the other via; and
    chemical vapor depositing an other conductive layer within the via to form a plug on top of the anti-fuse layer.

2. The method as recited in claim 1, further comprising the step of:
    etching away portions of the other conductive layer to form a top conductor on top of the plug.

3. The method as recited in claim 1, further comprising the steps of:
    etching back the other conductive layer to planarize the element;
    depositing a top conductive layer of a material different than the material of the other conductive layer on top of the plug and the interlayer dielectric;
    etching away portions of the top conductive layer to form a top conductor over the plug.

4. The method as recited in claim 1, wherein the anti-fuse layer comprises amorphous silicon.

5. The method as recited in claim 1, wherein the anti-fuse layer comprises amorphous silicon containing a dopant.

6. The method as recited in claim 5, wherein the dopant comprises boron.

7. The method as recited in claim 1, wherein the step of depositing the anti-fuse layer comprises the substep of:
    sputtering the anti-fuse layer to a thickness of about 50–500 angstroms.

8. The method as recited in claim 1, wherein the other conductive layer comprises tungsten.

9. The method as recited in claim 1, wherein the bottom conductive layer comprises aluminum.

10. The method as recited in claim 1, wherein the bottom conductive layer comprises an aluminum alloy.

11. The method as recited in claim 1, wherein the bottom conductive layer comprises tungsten.

12. The method as recited in claim 1, wherein the bottom conductive layer comprises titanium.

13. A method for forming a programmable element comprising the steps of:
providing a bottom conductive layer;
depositing an interlayer dielectric on top of a bottom conductive layer;
forming a via having sidewalls in the interlayer dielectric;
forming an other via having sidewalls in the interlayer dielectric coincident with the step of forming the via;
depositing an amorphous silicon anti-fuse layer on top of the interlayer dielectric and on the sidewalls and the bottom conductive layers within the via and other via;
etching away the anti-fuse layer from the bottom of the other via, and leaving the amorphous silicon anti-fuse layer on the sidewalls of the other via;
chemical vapor depositing a tungsten conductive layer on top of the amorphous silicon anti-fuse layer;
etching back the tungsten conductive layer to planarize the element and to form a tungsten plug within the via;
depositing a top conductive layer on top of the interlayer dielectric and over the tungsten plug within via; and
etching away portions of the top conductive layer to form a top conductor over the tungsten plug.

14. A method for forming a programmable element comprising the steps of:
providing a bottom conductive layer;
depositing an interlayer dielectric on top of a bottom conductive layer;
forming first and second vias in the interlayer dielectric having sidewalls;
depositing an amorphous silicon anti-fuse layer on top of the interlayer dielectric and on the sidewalls of the first and second vias and the bottom conductive layer within the first and second vias;
etching away the amorphous silicon anti-fuse layer from the bottom of the second via, and leaving the amorphous silicon anti-fuse layer on the sidewalls of the second via;
chemical vapor depositing a tungsten conductive layer on top of the amorphous silicon anti-fuse layer and within the vias;
etching back the tungsten conductive layer to planarize the element and to form first and second tungsten plugs within the first and second vias;
depositing a top conductive layer on top of the interlayer dielectric and over the first and second vias; and
etching away portions of the top conductive layer to form first and second conductors over the first and second tungsten plugs.

* * * * *